United States Patent [19]

Minagawa et al.

[11] Patent Number: 4,916,334
[45] Date of Patent: Apr. 10, 1990

[54] HIGH VOLTAGE BOOSTER CIRCUIT FOR USE IN EEPROMS

[75] Inventors: Hidenobu Minagawa, Kawasaki; Yuuichi Tatsumi, Tokyo; Hiroshi Iwahashi, Yokohama; Masamichi Asano, Tokyo; Mizuho Imai, Annaka, all of Japan

[73] Assignee: Kabushiki Kaisha Toshiba, Kawasaki, Japan

[21] Appl. No.: 226,312

[22] Filed: Jul. 29, 1988

[30] Foreign Application Priority Data

Jul. 29, 1987 [JP] Japan .................. 62-189435
Jul. 29, 1987 [JP] Japan .................. 62-189436

[51] Int. Cl.$^4$ .................. H03K 17/10; H03K 3/027; H03K 17/687; G11C 11/40
[52] U.S. Cl. .................. 307/296.5; 307/264; 307/482; 307/578; 365/191; 365/226; 365/104
[58] Field of Search .............. 307/270, 264, 475, 576, 307/579, 581, 584, 585, 304, 228, 263, 501, 473, 571; 328/181, 183, 185; 365/104, 184, 185, 226, 189, 191

[56] References Cited

U.S. PATENT DOCUMENTS

| | | | |
|---|---|---|---|
| 4,069,430 | 1/1978 | Masuda | 307/270 |
| 4,398,100 | 8/1983 | Tobita et al. | 307/482 X |
| 4,506,350 | 3/1985 | Asano et al. | 365/191 |
| 4,555,644 | 11/1985 | Devecchi et al. | 307/482 |
| 4,565,932 | 1/1986 | Kuo et al. | 307/270 X |
| 4,616,143 | 10/1986 | Miyamoto | 307/264 |
| 4,628,218 | 12/1986 | Nakaizumi | 307/578 X |
| 4,698,526 | 10/1987 | Allan | 307/585 X |
| 4,767,950 | 8/1988 | Schrenk | 307/264 X |

Primary Examiner—Andrew J. James
Assistant Examiner—David R. Bertelson
Attorney, Agent, or Firm—Finnegan, Henderson, Farabow, Garrett and Dunner

[57] ABSTRACT

A semiconductor integrated circuit includes a CMOS circuit operated on a voltage of a first voltage level to set an output node thereof to a voltage of the first voltage level or a reference voltage; an output circuit for controlling supply of a voltage of a second voltage level which is higher than the first voltage level to a signal output node; and an isolation MOS transistor having a current path connected between the output node of the CMOS circuit and the signal output node and a gate connected to receive a control signal. The output node of the CMOS circuit is set to the reference voltage with the conduction resistance of the isolation MOS transistor kept high after the lapse of period in which the voltage of the second voltage level is kept supplied to the signal output node. After this, the conduction resistance of the isolation MOS transistor is reduced in response to the control signal.

14 Claims, 13 Drawing Sheets

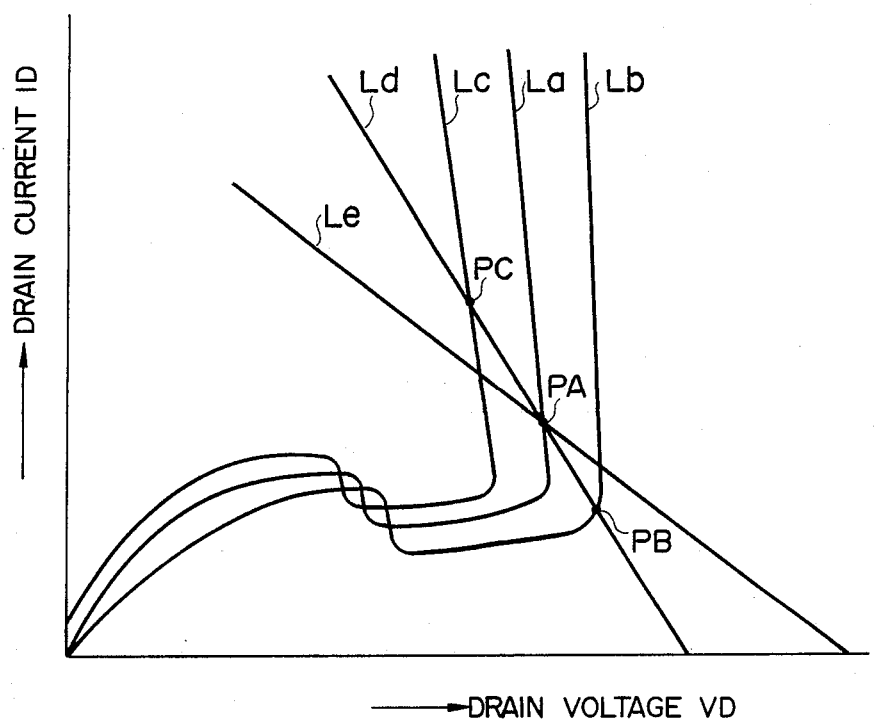
F I G. 2    (PRIOR ART)
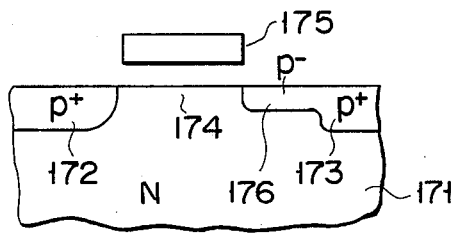
F I G. 3    (PRIOR ART)

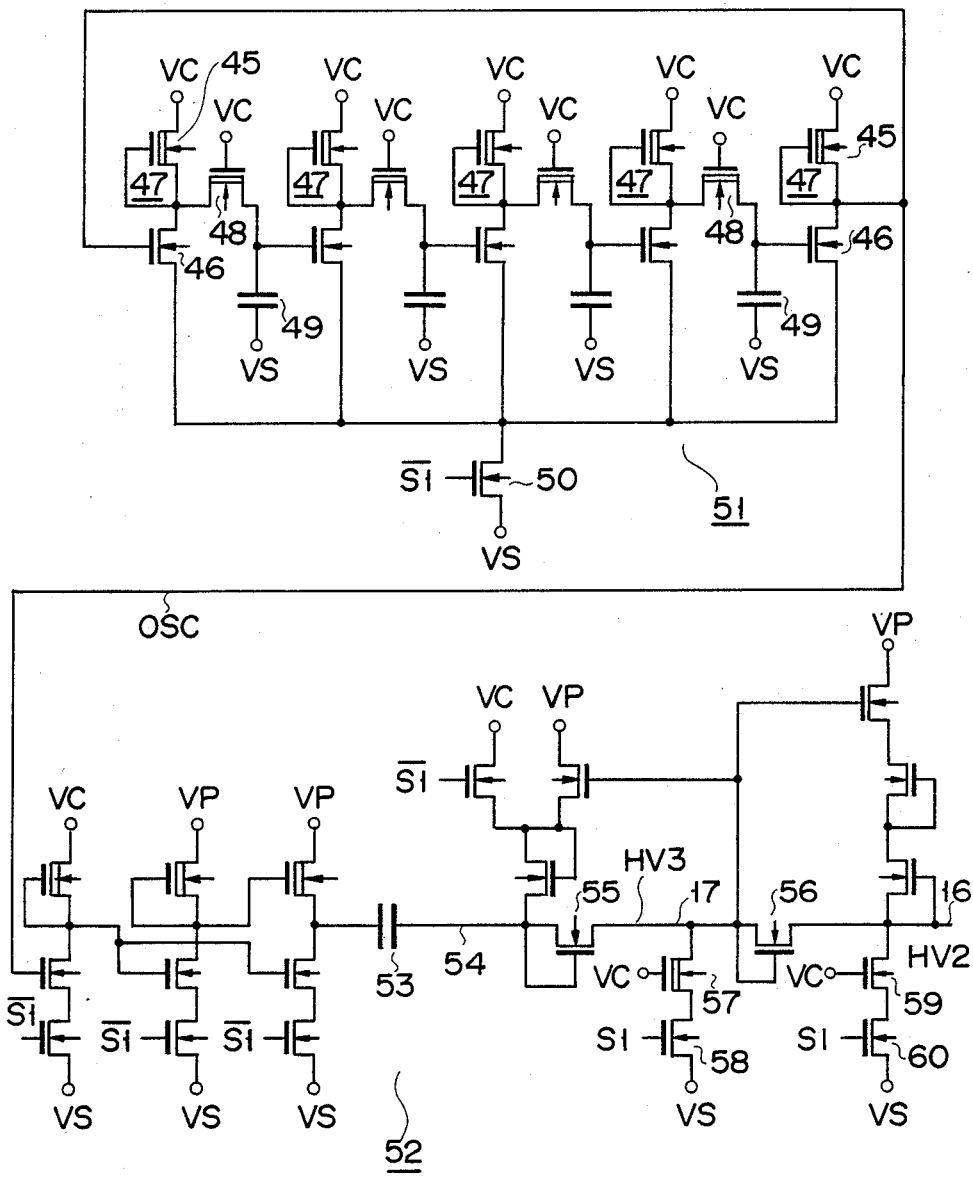
F I G. 8

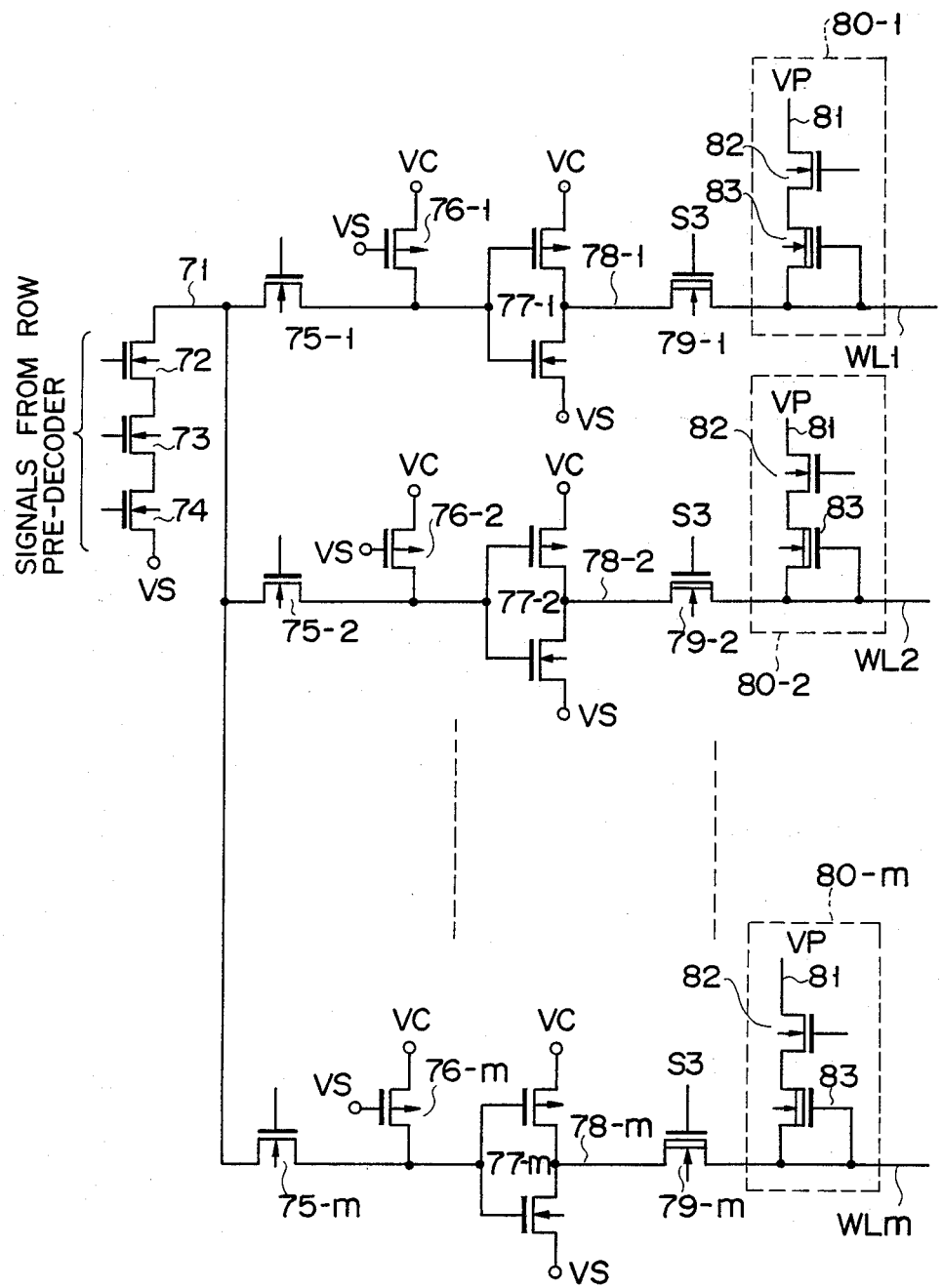
F I G. 9

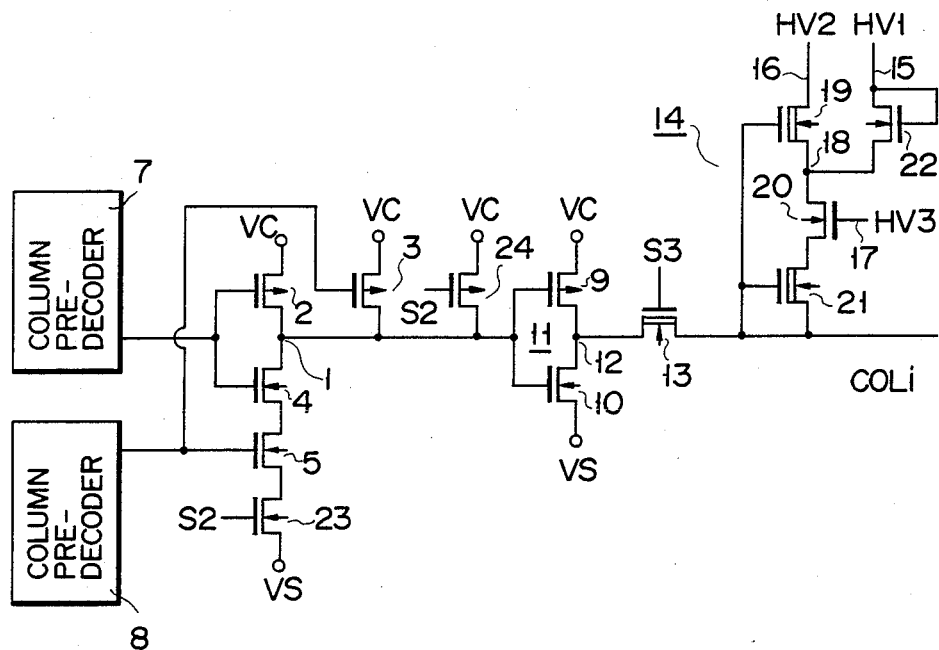
F I G. 12
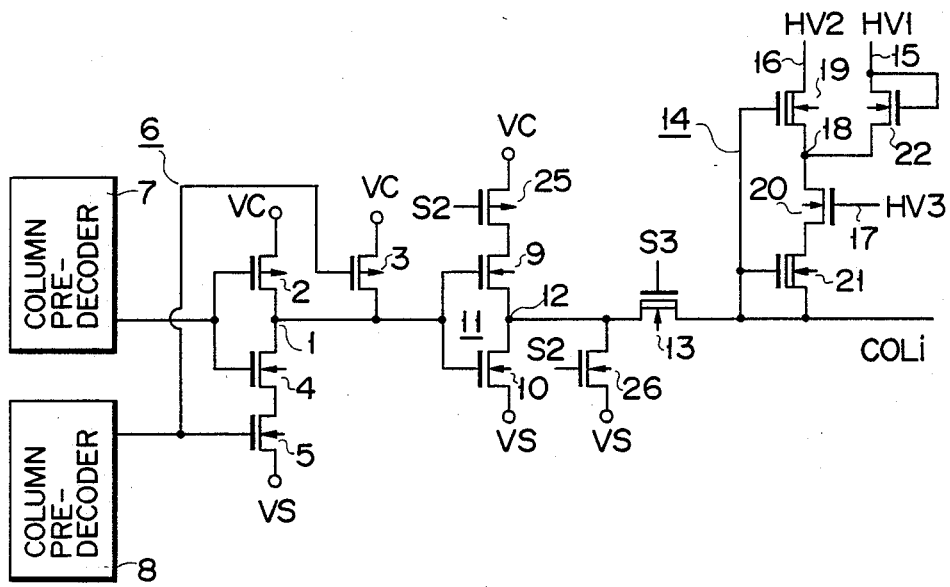
F I G. 13

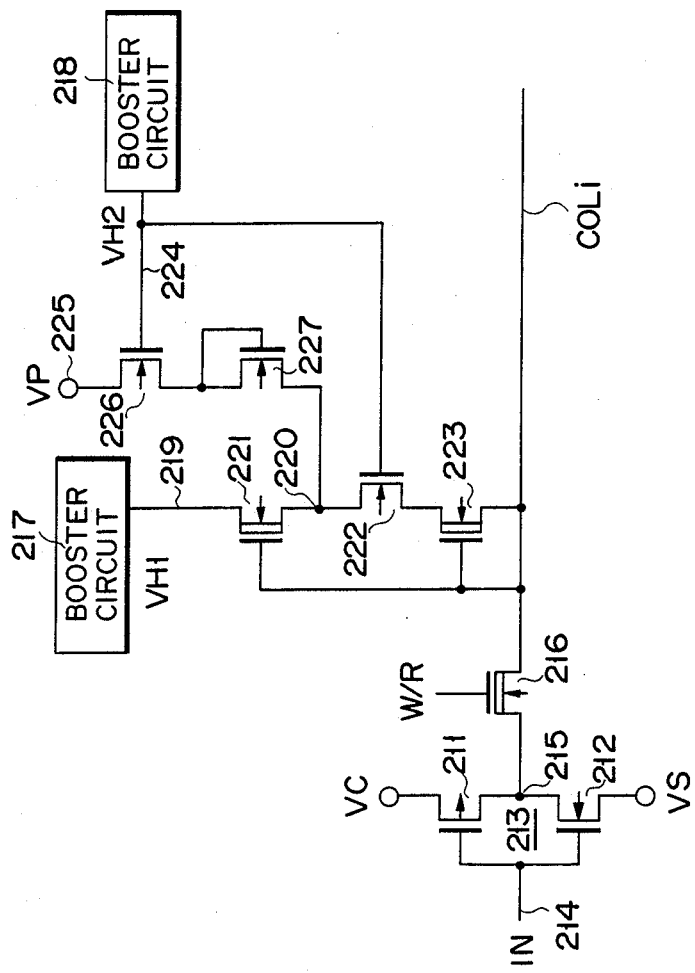
F I G. 14

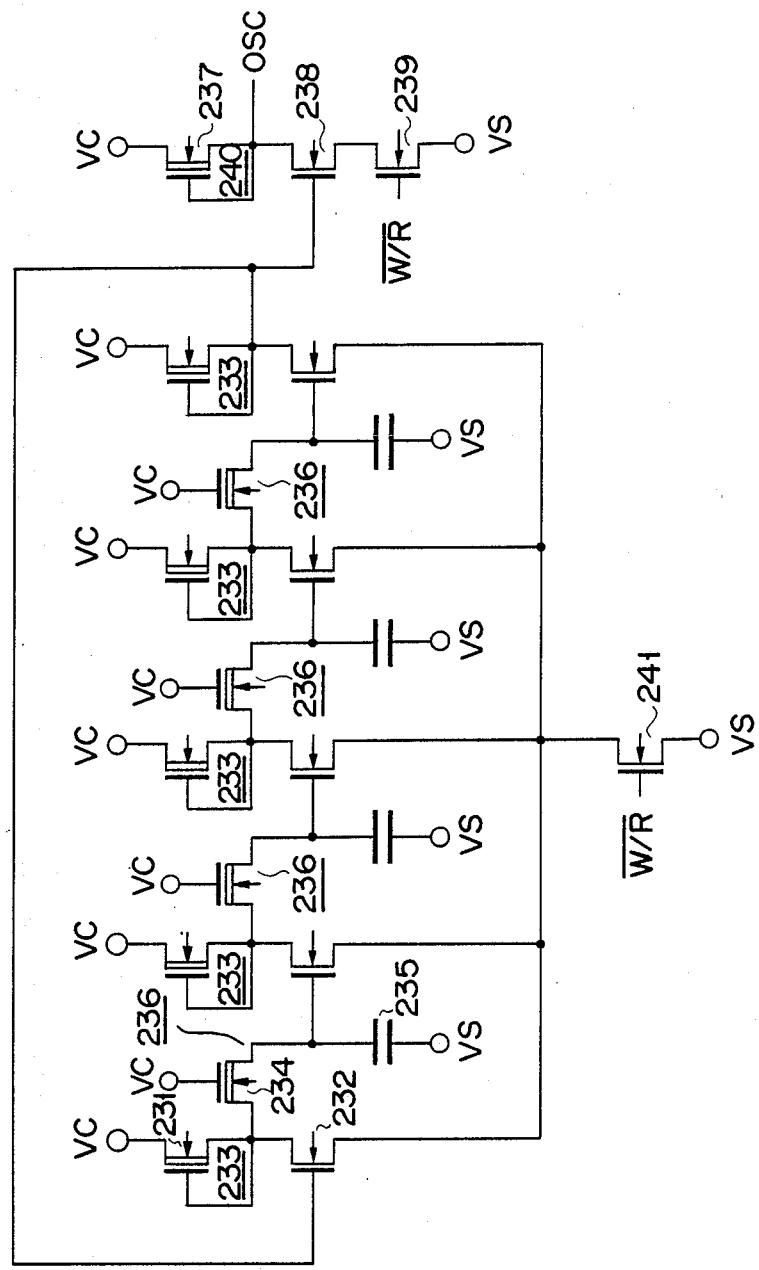
F I G. 15

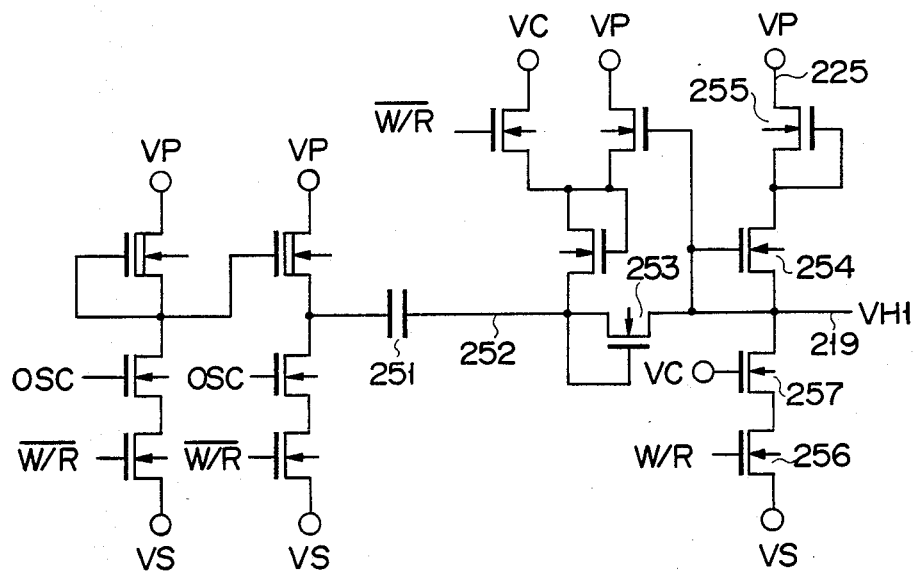
F I G. 16
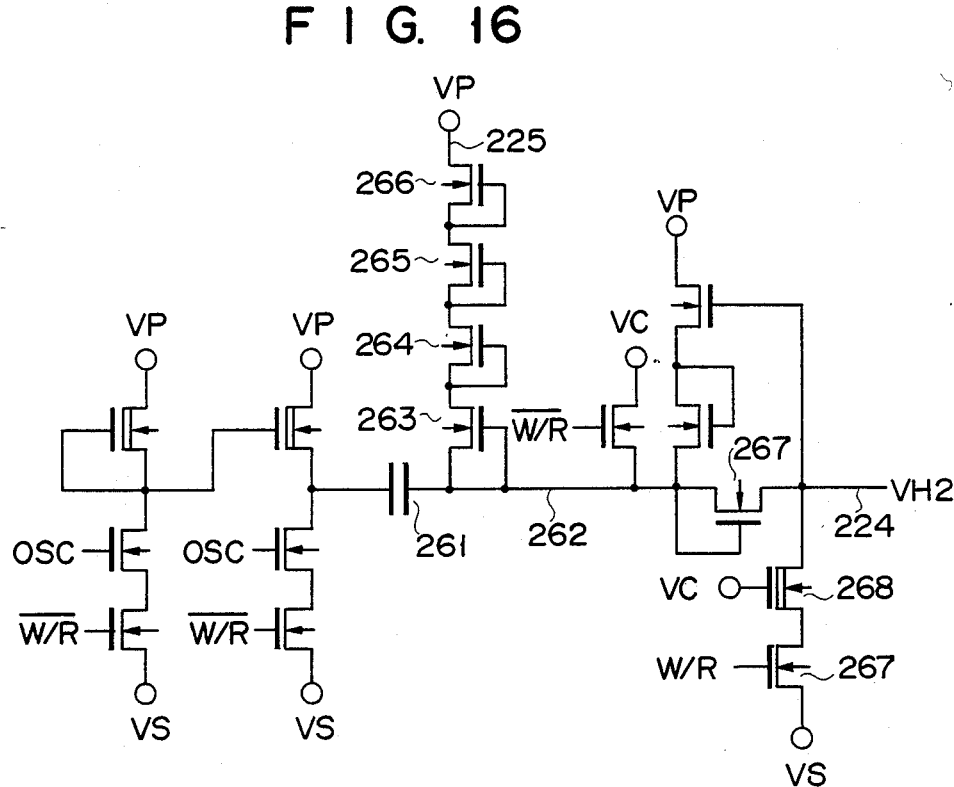
F I G. 17

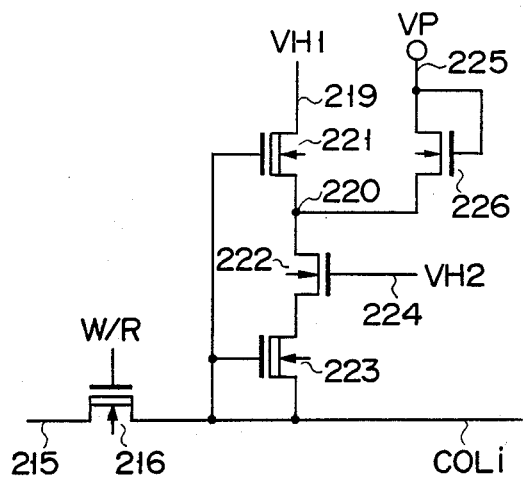
F I G. 18
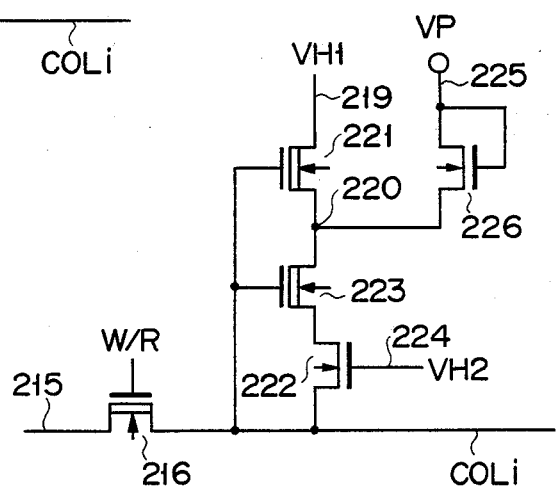
F I G. 19
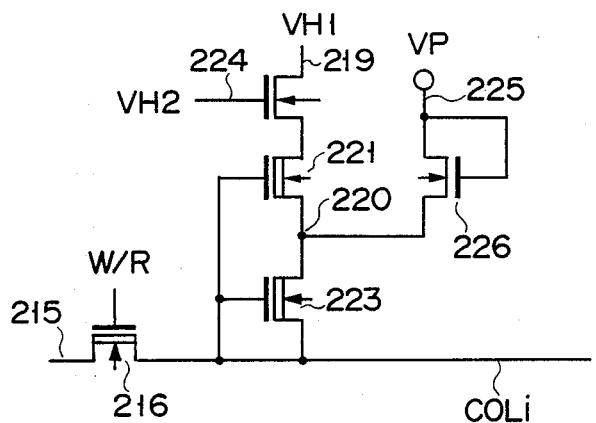
F I G. 20

HIGH VOLTAGE BOOSTER CIRCUIT FOR USE IN EEPROMS

BACKGROUND OF THE INVENTION

1. Field of the Invention

This invention relates to a semiconductor integrated circuit device having a booster circuit, and more particularly to a semiconductor integrated circuit in which an externally supplied high voltage is controlled according to a voltage output from a booster circuit.

2. Description of the Related Art

In nonvolatile semiconductor memory devices, or EPROMs having double gate type nonvolatile memory elements of floating gate structure as memory cells, data can be re-programmed, and therefore they are used in various data processing systems such as microcomputer systems. As is well known in the art, the double gate type nonvolatile memory element has two gate electrodes, that is, a floating gate and a control gate. If electrons are injected into the floating gate, the threshold voltage of the memory element is enhanced and therefore it will not be turned on even when a high level voltage, for example, 5 V is applied to the control gate. In contrast, if no electrons are injected into the floating gate, the memory element is kept in a neutral condition and the threshold voltage thereof is kept at the original low voltage level. Therefore, when a high level voltage is applied to the control gate, the memory element is turned on. Thus, data can be stored by the change of the threshold voltage. In reading the data, a high level voltage, for example 5 V, is applied to the control gate. The data stored in the memory element can be detected (read out) through a change in the channel current of the memory element. Further, data can be programmed by applying a voltage of, for example, 12.5 V which is sufficiently higher than the power source voltage (5 V) to the control gate and drain. When such a high voltage is applied, impact ionization occurs in the channel region near the drain, causing electron-hole pairs. At this time, electrons of the electron-hole pairs are injected into the floating gate. The electrons once injected into the floating gate are kept inside the floating gate unless the erasing operation is effected. That is, the memory data can be stored in a nonvolatile fashion.

When such EPROM is in a read mode, a read voltage, for example, 5 V, is applied to the control gate of the memory element, while when in a program mode, a program voltage of 12.5 V, is applied to the control gate and drain of the memory element. Therefore, EPROM has two power source terminals. The first power source terminal continuously receives an external power source voltage 5 V, and a second power source terminal receives a power source voltage of 5 V when in a read mode, but one of 12.5 V when in a program mode.

The EPROM includes a circuit for only data-reading operation, such as a second amplifier, a data output buffer, or the like, and a circuit designed for both data-reading operation and programming operation, such as a column decoder, a row decoder, or the like.

FIG. 1 is a circuit diagram schematically showing the construction of an ordinary EPROM having the nonvolatile memory elements described above as memory cells. Row lines WL1 to WLm are connected to receive decoded outputs from row decoder 131, and column selection lines COL1 to COLn are connected to receive decoded outputs from column decoder 132. The gate of n column selection transistors C1 to Cn are respectively connected to n column selection lines COL1 to COLn, and column selection transistors C1 to Cn are controlled by respective signals supplied via column selection lines COL1 to COLn. First ends of the current paths of column selection transistors C1 to Cn are connected commonly to node 133, and second ends of the current paths are connected to n column lines BL1 to BLn which are arranged to cross row lines WL1 to WLm. Further, memory cells M11 to Mmn constituted by double gate MOS transistors each having a floating gate and a control gate are connected are respective points at which row lines WL1 to WLm cross column lines BL1 to BLn. Each of the control gates of memory cells M11 to Mmn is connected to a corresponding one of row lines WL1 to WLm, each of the drains thereof is connected to a corresponding one of column lines BL1 to BLn, and all the sources thereof are connected to a preset voltage application point, for example, ground voltage (0 V) terminal VS. Node 133 is connected to a source of MOS transistor 134. The drain of MOS transistor 134 is connected to external programming voltage terminal VP, and the gate thereof is connected to an output node of data programming circuit 135. Data programming circuit 135 supplies programming data DIN which is set at a VS voltage or a high voltage according to data of "1" or "0" to be programmed. Further, node 133 is connected to sense amplifier circuit 136, and data corresponding to a potential at node 133 is sensed by means of sense amplifier circuit 136 in the data readout mode.

In the EPROM described above, when data of "0" of programmed into a single memory cell, for example, memory cell M11, signal DIN supplied from data programming circuit 135 is set to a high voltage level and column selection line COL1 is set to a high voltage by a decoded output from column decoder 132. High voltage signal DIN causes transistors 134 to be turned on, and column selection transistor C1 is turned on by column selection line COL1 which is set at a high voltage, causing external programming voltage VP to be applied to column line BL1. At this time, row line WL1 is set to a high voltage by a decoded output from row decoder 131, and thus the control gate and drain of selected memory cell M11 are both set to a high voltage. In this way, electrons generated by impact ionization as described before are injected into the floating gate of memory cell M11, thus programming data "0". In contrast, when data "1" is programmed into memory cell M11, signal DIN from data programming circuit 135 is set to voltage VS of 0 V. At this time, since transistor 134 is kept in the OFF state, external programming voltage VP is not applied to column line BL1. Therefore, the floating gate of selected memory cell M11 is kept in the neutral condition.

Recently, in order to attain high integration density, the size of the nonvolatile memory element described above tends to be reduced, and external programming voltage VP is lowered with the miniaturization. Therefore, it is a common practice to effect data programming in the avalanche region in which the programming efficiency is high in order to attain short programming time and sufficiently large operation margin.

FIG. 2 shows the programming characteristics (drain voltage VD-drain current ID characteristics) of memory cell M11 when a high voltage is applied to the gates of MOS transistors 134 and C1 to Cn and a programming high voltage is applied to the control gate of memory cell M11 in the EPROM of FIG. 1. Curve La in FIG. 2 indicates the dependency of the drain voltage on the drain current of memory cell M11, and line Ld indicates the load characteristics of a load circuit including MOS transistors 134 and C1 operated in the condition described above. At this time, data programming is effected with the drain voltage and the drain current obtained at point PA at which curve La crosses line Ld. Generally, it is well known in the art that the channel length of memory cell M11 varies in a certain range in the manufacturing process. The dependency of the drain voltage on the drain current of memory cell M11 will be indicated by curve Lb or Lc when the channel length becomes longer or shorter than a preset value, respectively. The operation point of data programming is set on point PB at which curve Lb crosses line Ld when the channel length becomes longer. Therefore, in this case, it becomes difficult to effect the data programming in the avalanche region, lowering the programming margin. In contrast, when the channel length becomes shorter, the operation point of data programming is set on point PC at which curve Lc crosses line Ld. In this case, data can be programmed in the avalanche region, but the drain current will significantly increases. Therefore, in order to effect stable programming and keep the drain current at a constant level even when the channel length of the memory cell varies, it becomes necessary to set the operation point of data programming in a limited range. For this purpose, the inclination of the load characteristic curve may be set small as shown by line Le, for example. Therefore, it becomes common practice to apply a high voltage which is stepped up to be higher than external programming voltage VP to the gates of MOS transistors 134 and C1 to Cn, thereby compensating for the voltage drop due to the threshold voltage of each transistor.

The conventional EPROM is generally formed of N-channel structure using an N-channel MOS process. However, in the personal computer such as hand-held computers (lap-top computers), the EPROM tends to be formed of CMOS structure in order to lower the power consumption. For example, column decoder 132, row decoder 131 and data programming circuit 135 in the conventional EPROM shown in FIG. 1 and using a booster circuit are formed of CMOS structure.

However, in the EPROM having such circuits as the column decoder, row decoder and data programming circuit of the CMOS structure which control a high voltage supplied externally by use of the boosted voltage, a latch-up phenomenon tends to easily occur because a high voltage is used for data programming. The latch-up phenomenon will occur when a parasitic thyristor is formed of, for example, a parasitic NPN transistor which is constituted by an N-channel MOS transistor formed in a P-type substrate and a parasitic PNP transistor which is constituted by a P-channel transistor formed in N-type well region, and if the parasitic thyristor is triggered and turned on by a high voltage, thereby causing a D.C. current to flow between the power source terminals. Furthermore it is necessary to use transistors with high drain breakdown voltage as transistors in the high voltage-operated circuit. The transistor with high drain breakdown voltage is formed as shown in the cross section of FIG. 3 in a case of P-channel transistor, for example. That is, source region 172 and drain region 173 of P-type high impurity concentration are formed in N-well region 171, and gate electrode 175 is formed on channel 174 between regions 172 and 173 with an insulation film (not shown) disposed between channel 174 and electrode 175. In order to achieve high drain breakdown voltage, P⁻ region 176 of low impurity concentration is formed on that portion of drain region 173 which is in contact with channel 174. The structure is known as an LDD (Lightly Doped Drain) structure. As described above, in the LDD structure, since P⁻ region 176 of low impurity concentration is formed, it is necessary to provide a larger element area in comparison with the ordinary transistor which is not an LDD structure. Further, in a case where a P-channel MOS transistor is formed with a P-type substrate, the P-channel MOS transistor is formed in an N-well region. It becomes necessary to dispose the N-well region in which a circuit for only data reading operation is formed separately from the N-well region in which a circuit for both data-reading operation and programming operation formed.

As described above, in the prior art, P- and N-channel MOS transistors are formed to have high drain breakdown voltage, thus increasing the entire surface area and increasing the chip size. And a latch up phenomenon tends to easily occur because a high voltage is applied to a P-channel MOS transistor and a N-well region.

SUMMARY OF THE INVENTION

An object of this invention is to provide a semiconductor integrated circuit device in which the latch-up phenomenon can be prevented without increasing the chip size.

Another object of this invention is to provide a semiconductor integrated circuit device of which the chip size may be made small.

According to one embodiment of this invention, there is provided a semiconductor integrated circuit device comprising a CMOS circuit operated on a voltage of a first voltage level to set an output node thereof to a voltage of the first voltage level or a reference voltage; an output circuit for supplying a voltage of a second voltage level which is higher than the first voltage level to signal output node; and an isolation MOS transistor having a current path connected between the output node of the CMOS circuit and the signal output node and a gate connected to receive a control signal, wherein the output node of the CMOS circuit is set to the reference voltage with the conduction resistance of the isolation MOS transistor kept high after the lapse of period in which the voltage of the second voltage level is kept supplied to the signal output node, and then the conduction resistance of the isolation MOS transistor is reduced in response to the control signal.

With the construction of the above embodiment, the output node of the CMOS circuit is set to the reference voltage with the conduction resistance of the isolation MOS transistor kept high. Therefore, the signal output node to which the voltage of the second voltage level is supplied is discharged through the isolation MOS transistor and an N-channel MOS transistor of the CMOS circuit. At this time, a voltage higher than the absolute value of the threshold voltage of the isolation MOS transistor will not applied to the CMOS circuit.

With this construction, a semiconductor integrated circuit device can be obtained in which the latch-up phenomenon can be prevented and the chip size can kept small.

According to another embodiment of this invention, there is provided a semiconductor integrated circuit device comprising first and second nodes which are respectively connected to receive first and second control signals; a third node from which an output signal is supplied; a fourth node connected to receive high voltage; a CMOS circuit including MOS transistors of first and second channel types and connected to receive the first control signal which is supplied to the first node; a first MOS transistor of the first channel type having a current path connected between the output node of the CMOS circuit and the third node and a gate connected to the second node; first and second booster circuits for generating voltages higher than the high voltage applied to the fourth node; a second MOS transistor of the first channel type and depletion type having a current path connected between the output node of the first booster circuit and a fifth node and a gate connected to the third node; a third MOS transistor of the first channel type and enhancement type having a current path connected between the third and fifth nodes and a gate connected to the output node of the second booster circuit; and a fourth MOS transistor of the first channel type and enhancement type having a current path connected between the fourth and fifth nodes and a gate connected to receive a voltage higher than the high voltage applied to the fourth node.

According to still another embodiment of this invention, there is provided a semiconductor integrated circuit device comprising first and second nodes which are respectively connected to receive first and second control signals; a third node from which an output signal is supplied; a fourth node connected to receive a high voltage; a CMOS circuit including MOS transistors of first and second channel types and connected to receive the first control signal which is supplied to the first node; a first MOS transistor of the first channel type having a current path connected between the output node of the CMOS circuit and the third node and a gate connected o the second node; a booster circuit for generating a voltage higher than the high voltage applied to the fourth node; a second MOS transistor of the first channel type and depletion type having a current path connected between the output node of the booster circuit and a fifth node and a gate connected to the third node; a third MOS transistor of the first channel type and depletion type having a current path connected between the third and fifth nodes and a gate connected to the third node; and a fourth MOS transistor of the first channel type and enhancement type having a current path connected between the fourth and fifth nodes and a gate connected to the fourth node.

With the construction of the above embodiments, when a high voltage is supplied from the third node, a higher voltage is generated from the first and/or second booster circuit. When the third node is set to a high voltage level via the first MOS transistor by the output signal of the CMOS circuit, the high voltage applied to the fourth node is supplied to the third node via the fourth and third MOS transistors. Further, the output voltage of the first booster circuit is supplied to the third node via the second and third MOS transistors. The voltage of the fifth node is set by the high voltage applied to the fourth node so as to turn off the second MOS transistor when the third node is set to a low voltage level via the first MOS transistor by the output of the CMOS circuit.

When the high voltage is not generated from the third node, no high voltage is generated from the first and second booster circuits, thereby setting the third MOS transistor into the turn-off state. At this time, the third node is set to a high or low level voltage via the first MOS transistor by the output of the CMOS circuit.

With the construction described above, the high voltage-operated circuit is constituted by single-channel MOS transistors so that the latch-up can be effectively prevented and the chip size can be kept small.

BRIEF DESCRIPTION OF THE DRAWINGS

FIG. 2 is a diagram showing the programming characteristics of a memory cell used in the EPROM shown in FIG. 1;

FIG. 3 is a cross sectional view of a MOS transistor formed to have a high withstanding voltage;

FIG. 8 is a circuit diagram showing the detail construction of a booster circuit used in the circuit of FIG. 4;

FIG. 9 is a circuit diagram showing a circuit section relating to a row selection line of a row decoder used in an EPROM according to a second embodiment of this invention;

FIGS. 12 and 13 are circuit diagrams showing the construction of modifications of the circuit shown in FIG. 4;

FIG. 14 is a circuit diagram showing a circuit section relating to a column selection line of a column decoder used in an EPROM according to a fourth embodiment of this invention;

FIG. 15 is a circuit diagram showing the detail construction of an oscillator circuit used in the circuit of FIG. 14;

FIGS. 16 and 17 are circuit diagrams showing the detail construction of a booster circuit used in the circuit of FIG. 14;

FIGS. 18 to 20 are circuit diagrams each showing a circuit section relating to a column selection line of a column decoder used in an EPROM according to fifth to seventh embodiments of this invention.

DETAILED DESCRIPTION OF THE PREFERRED EMBODIMENTS

Figure 1:
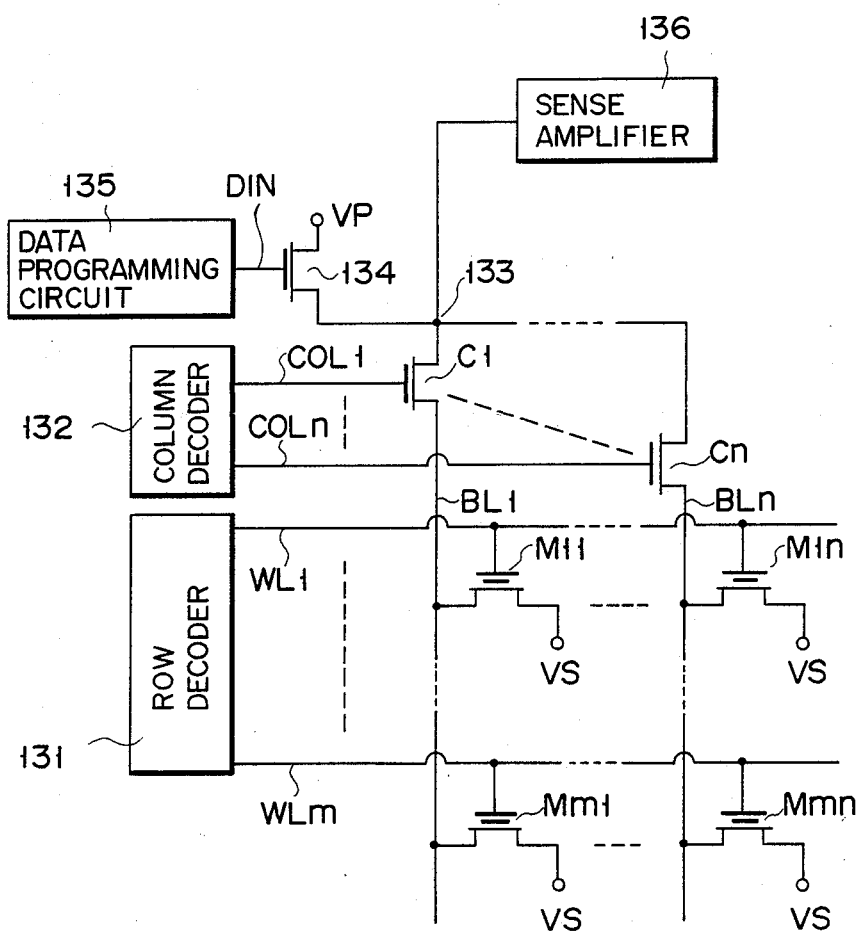
FIG. 1 is a circuit diagram showing the schematic construction of the conventional EPROM.
Figure 4:
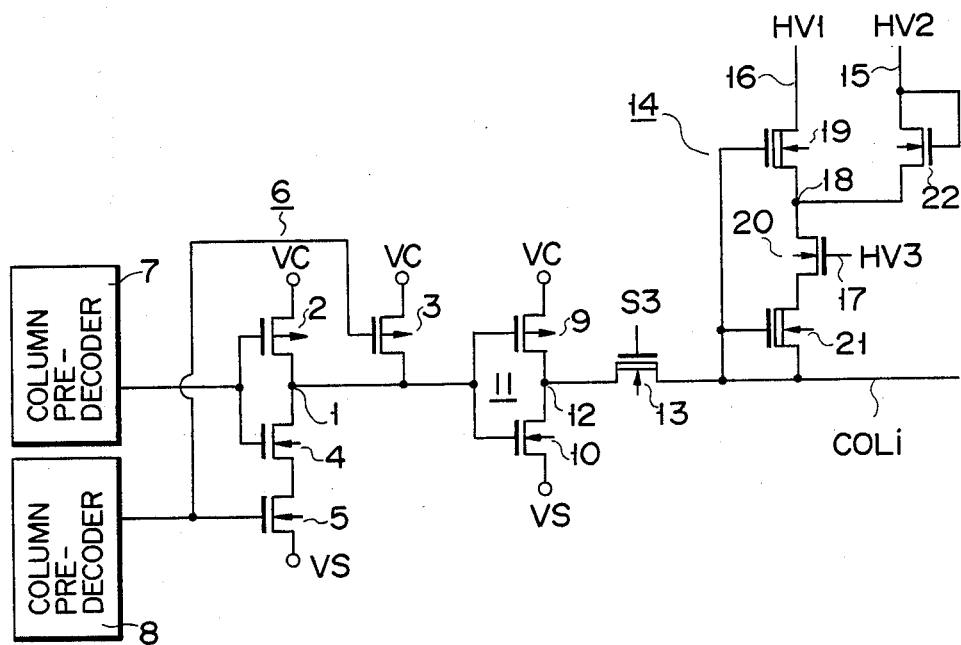
FIG. 4 is a circuit diagram showing a circuit section relating to a column selection line of a column decoder used in a EPROM according to one embodiment of this invention.

FIG. 4 is a circuit diagram showing a circuit section relating to a column selection line COLi of column decoder 132 (shown in FIG. 1) in a case where this invention is applied to the EPROM shown in FIG. 1.

For example, the current paths of two enhancement type (E-type) P-channel MOS transistors 2 and 3 are connected to parallel between node 1 and readout voltage terminal VC which is normally kept at 5 V. Further, the current paths of two E-type P-channel MOS transistors 4 and 5 are connected in series between node 1 and ground potential terminal VS. MOS transistors 2 to 5 constitute a two-input CMOS NAND circuit 6. Each of the gates of transistors 2 and 4 of CMOS NAND circuit 6 is connected to receive an output signal of column pre-decoder 7, and each of the gates of transistors 3 and 5 is connected to receive an output signal of column pre-decoder 8. Output node 1 of CMOS NAND circuit 6 is connected to an input node of CMOS inverter 11 formed of P-channel MOS transistor 9 and N-channel MOS transistor 10. Output node 12 of inverter 11 is connected to one end of the current path of depletion type (D-type) N-channel MOS transistor 13 whose gate is connected to receive control signal S3. The other end of the current path of MOS transistor 13 is connected to a corresponding column selection line COLi. Control signal S3 is usually set to a ground potential level ("0" level) in the data programming mode and to voltage VC ("1" level) in the data readout mode.

Output circuit 14 supplies a high voltage to column selection line COLi. For example, voltage HV1 which is lower than external programming voltage VP by the threshold voltage of the E-type N-channel MOS transistor is applied to node 15, and voltage HV2 which is higher than programming voltage VP by the threshold voltage of the E-type N-channel MOS transistor is applied to node 16. Further, voltage HV3 which is higher than programming voltage VP by the sum of the threshold voltages of two E-type N-channel MOS transistors is applied to node 17. High voltages HV2 and HV3 are generated from booster circuits as will be described later. The current path of D-type N-channel MOS transistor 19 is connected between nodes 16 and 18. The gate of transistor 19 is connected to column selection line COLi. Further, the current paths of E-type N-channel MOS transistor 20 and D-type N-channel MOS transistor 21 are connected in series between node 18 and column selection line COLi, and the gates of MOS transistors 20 and 21 are respectively connected to node 17 of high voltage HV3 and column selection line COLi. The current path of E-type N-channel MOS transistor 22 is connected between nodes 15 and 18, and the gate of transistor 19 is connected to node 15.

Figure 5:
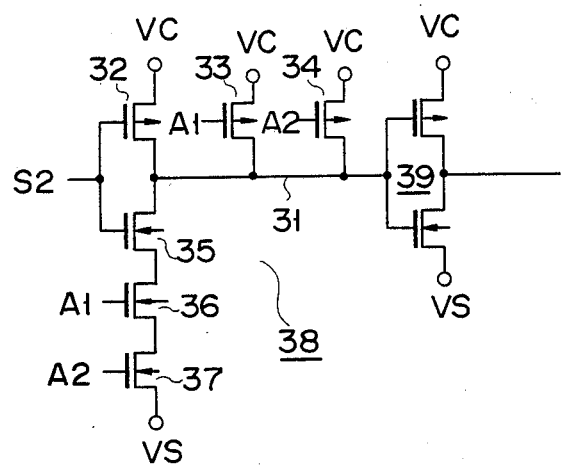
FIG. 5 is a circuit diagram showing the detail construction of a column pre-decoder used in the circuit of FIG. 4.

FIG. 5 is a circuit diagram showing the detail construction of column pre-decoder 7 in the circuit of FIG. 4. The current paths of three E-type P-channel MOS transistors 32 to 34 are connected in parallel between node 31 and voltage terminal VC. The current paths of three E-type N-channel MOS transistors 35 to 37 are connected in series between node 31 and voltage terminal VC. MOS transistors 32 to 37 constitute three-input CMOS NAND circuit 38. The gates of MOS transistors 32 and 35 are connected to receive control signal S2, the gates of MOS transistors 33 and 36 are connected to receive address signal A1, and the gates of MOS transistors 34 and 37 are connected to receive address signal A2. An output of NAND circuit 38 is supplied to CMOS inverter 39 formed of E-type P- and N-channel MOS transistors whose current paths are connected between voltage terminals VC and VS. An output of inverter 39 is supplied to transistors 2 and 4 of FIG. 1 as an output of column pre-decoder 7. Column pre-decoder 8 is formed in the same manner as column pre-decoder 7 shown in FIG. 5 except that a different two-bit address input is supplied.

Now, the operation of the circuit is explained. In a case where data is read out from memory cell Mji (j is an integer ranging from 1 to m, and i is an integer ranging from 1 to n) shown in FIG. 1, or in the data readout mode, control signals S2 and S3 are set at "1" level (5 V) as shown by the timing chart in FIG. 6. At this time, high voltages HV1, HV2 and HV3 at nodes 15, 16 and 17 are all set to ground voltage VS. Thus, control signal S2 is set to "1" level so as to turn off transistor 32 shown in FIG. 5, causing NAND circuit 38 to function as a two-input NAND circuit. At this time, if outputs of column pre-decoders 7 and 8 are both set at "1" level, then a signal of output node 1 of NAND circuit 6 is set to "0" level, causing a signal on output node 12 of inverter 11 to be set at "1" level of 5 V. Further, since a 5 V signal is applied to the gate of D-type transistor 13 to turn on the transistor, column selection line COLi is also set to "1" level of 5 V via transistor 13. In contrast, when at least one of outputs of column pre-decoders 7 and 8 is at "1" level, a signal at output node 1 of NAND circuit 6 is set at "1" level and a signal at output node 12 of inverter 11 is set at "0" level, thus setting column selection line COLi to 0 V.

Figure 6:
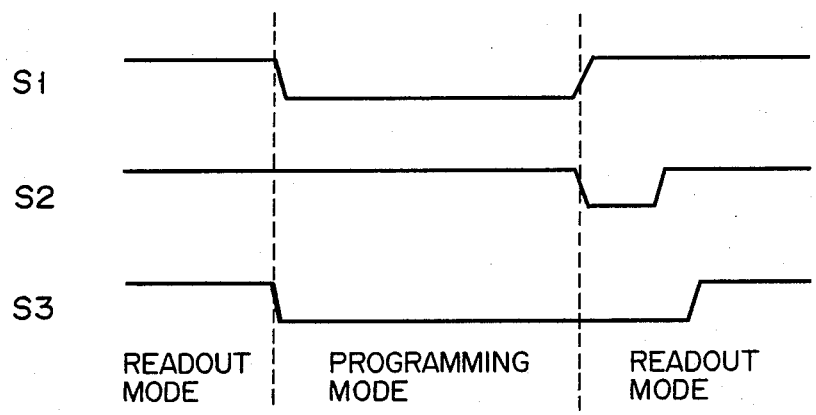
FIG. 6 is a timing chart for illustrating the operation of the circuit shown in FIG. 4.

In a case where data is programmed into memory cell Mji shown i FIG. 1, or in a data programming mode, control signal S2 is set to "1" level and control signal S3 is set to "0" level as shown in FIG. 6. At this time, preset high voltages are applied to nodes 15, 16 and 17 in FIG. 4. Assume now that outputs of column predecoders 7 and 8 are both at "1" level. Then, a signal on output node 1 of NAND circuit 6 is set to "0" level, and a signal on output node 12 of inverter 11 is set to voltage VC of 5 V. At this time, since a signal of 0 V is applied to the gate of D-type transistor 13, a voltage which is 2.5 V to 3 V and corresponds to the absolute value of the threshold voltage of the D-type transistor is supplied to column selection line COLi via transistor 13. Therefore, transistors 19 and 21 whose gates are connected to column selection line COLi are turned on. In this case, since high voltage HV1 is applied to node 15 and high voltage HV3 is applied to node 17, transistors 22 and 20 are both turned on. Therefore, high voltage HV1 is supplied to column selection line COLi via transistors 22 and 20, and the voltage of line COLi is raised to substantially to voltage HV1. Further, since high voltage HV2 is applied to node 16 and voltage HV3 higher than high voltage HV2 by the threshold voltage of an E-type N-channel MOS transistor is applied to the gate of transistor 20, high voltage HV2 is applied to column selection line COLi via transistors 19, 20 and 21. At this time, since one end of the current path of D-type transistor 13 is connected to receive voltage VC of 5 V of output node 12 of inverter 11, transistor 12 is turned off. Therefore, there is no possibility that high voltage HV2 supplied to column selection line COLi is applied to transistors constituting CMOS inverter 11 in the low voltage-operated circuit section. When high voltage HV2 is applied to column selection line COLi, transistor Ci shown in FIG. 1 are connected to line COLi is turned on. In this case, since gate voltage HV2 thereof is higher than high voltage VP by the threshold voltage of an E-type MOS transistor, high voltage VP is applied to corresponding column line BLi.

In contrast, if at least one of output signals of column pre-decoders 7 and 8 is at "0" level, a signal on output node 1 of NAND circuit 6 is set to "1" level and a signal on output node 12 of inverter 11 is set to "0" level. Therefore, column selection line COLi is set to 0 V via D-type transistor 13. At this time, current flows from node 15 of high voltage HV1 via the current paths of transistors 22, 20, 21 and 13 and N-channel MOS transistor 10 of inverter 11. Further, if element dimensions of transistors 22, 20, 21, 13 and 10 are determined so as to set a voltage of node 18 higher than the absolute value of the threshold voltage of transistor 19, transistor 19 is turned off, preventing current loss due to boosted high voltage HV2. In this case, if the conduction resistance of E-type MOS transistor 17 is set to be high, D-type MOS transistor 21 can be omitted.

In the normal EPROM, in order to check the programmed data after the programming operation, it is common practice to read out the programmed data immediately after the data is programmed. This is generally called verify mode. In the verify mode, as shown in FIG. 6, control signal S2 is set to "0" level in a certain period of time at the beginning of the verify mode, and then set to "1" levels as in the ordinary readout mode. In this case, control signal S3 is set to "1" level after control signal S2 is changed from "0" level to "1" level.

In the verify mode, it becomes necessary to supply voltage VC of 5 V or voltage of 0 V to column selection line COLi according to an output of inverter 11 in the same manner as in the ordinary readout mode. In this case, if signal S3 is set to "1" level when the programming mode is completed, D-type transistor 13 is turned on, and high voltage HV2 which has been applied to column selection line COLi in the programming mode is applied to inverter 11 which is a low voltage-operated circuit. At this time, if P-channel MOS transistor 9 in inverter 11 is conductive, high voltage HV2 is applied to a p+-type diffusion region which is the drain region of P-channel MOS transistor 9. Thus, the potential of the diffusion region becomes higher than an n-well potential to permit a forward current flow, causing a latch-up. However, in the circuit described above, control signal S3 is kept at "0" level at the beginning of the verify mode so that D-type transistor 13 will be kept nonconductive, and therefore a voltage of node 12 will not become higher than the absolute value of the threshold voltage of the D-type transistor. Further, at the beginning of the verify mode, control signal S2 is set at "0" level for a preset period of time. Therefore, transistor 32 in the column pre-decoder of FIG. 5 is turned on, thus setting the signal of output node 31 of NAND circuit 38 to "0" level irrespective of the address signal. As a result, an output of inverter 39 is set to "0" level, and a signal of output 1 of NAND circuit 6 shown in FIG. 4 is set to "1" level. That is, N-channel MOS transistor 10 of inverter 11 is kept conductive irrespective of the address signal in a period in which control signal S2 is set at "0" level. Therefore, high voltage HV2 which has been applied to column selection line COLi in the programming mode is discharged via transistors 13 and 10. In this way, it is prevented that a latch-up is caused in the low voltage-operated circuit by high voltage HV2 which has been applied to column selection line COLi in the programming mode. High voltage HV3 is set to "0" before control signal S2 is set to "0" level. After high voltage HV2 is discharged, control signal S2 is set to "1" level, permitting the column pre-decoder to operate according to the address signal. At the same time, control signal S3 is set to "1" level, causing transistor 13 to be turned on.

An n number of circuits which are each formed to have the same construction as the circuit of FIG. 4 and which corresponds in number to the column selection lines of the circuit shown in FIG. 1 are provided. In a case where the EPROM shown in FIG. 1 is formed to have a plural-bit structure, FIG. 4 circuits of a number equal to n times the number of bits are provided. In such a case, a high voltage applied to nodes 15 and 16 and 17 can be commonly used in all the circuits.

In the FIG. 4 circuit, transistors 13, 19, 20, 21 and 22 of the high voltage-operated circuit to which a high voltage is applied are formed to have N-channel and they are all formed in the form of LDD structure shown in FIG. 3 to have a high withstanding voltage. Therefore, in the high voltage-operated circuit, formation of P-channel MOS transistor is not necessary, and occurrence of the latch-up which has been the problem in the prior art will be prevented. Further, since formation of P-channel MOS transistor which is formed to have a high withstanding voltage is not necessary, it becomes unnecessary to form an N-well region to which a high voltage is applied, thereby reducing the size of the entire area. In the data readout mode, a D.C. current consumption can be suppressed to substantially 0 as in the case of the conventional CMOS structure.

That is, in the circuit of the first embodiment, the high voltage-operated circuit is formed of only N-channel MOS transistors, and a high voltage is selectively output in the data programming mode to improve the programming characteristics. Further, in the data readout mode, the current consumption can be suppressed to 0 as in the CMOS structure. Also, latch-up due to a high voltage used in the verify mode can be prevented.

Figure 7:
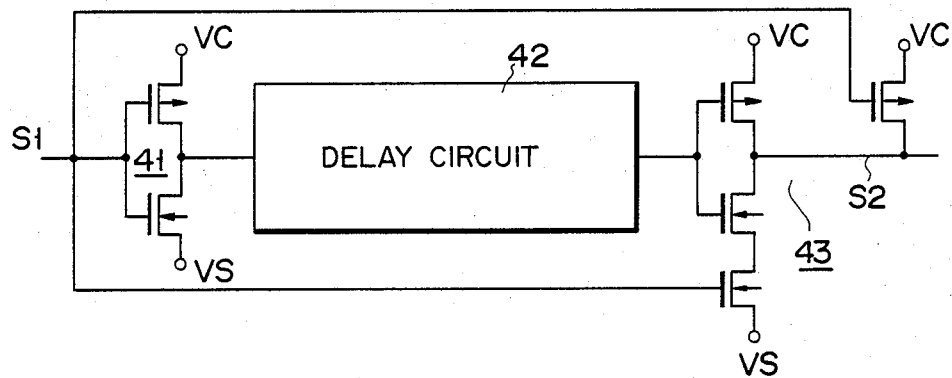
FIG. 7 is a circuit diagram showing the detail construction of a control signal generating circuit used in the circuit of FIG. 4.

FIG. 7 is a circuit diagram showing the construction of a signal generating circuit for generating control signal S2 based on control signal S1 which is set to "0" level in the data programming mode and to "1" level in the other period of time. Control signal S1 is supplied to CMOS inverter 41 formed of P- and N-channel MOS transistors. An output of inverter 41 is supplied to delay circuit 42. Control signal S1 and output signal of delay circuit 42 are supplied to CMOS NAND circuit 43 formed of P- and N-channel MOS transistors, and control signal S2 is derived as an output of NAND circuit 43.

FIG. 8 is a circuit diagram showing the detail construction of the booster circuit for generating stepped-up high voltages HV2 and HV3. The booster circuit includes ring oscillation circuit section 51 constituted by E/D inverters 47, delay circuits and MOS transistor 50. An odd number (five in FIG. 8) of E/D inverters 47 each of which includes D-type MOS transistor 45 as a load transistor and E-type MOS transistor 46 as a driver transistor are connected in series. The delay circuits each of which includes D-type MOS transistor 48 and capacitor 49 are each connected between the successive inverters. In this case, an output of the inverter of the last stage is fed back to the inverter of the first stage, and E-type MOS transistor 50 whose gate is connected to receive an inverted signal $\overline{S1}$ of control signal S1 is connected between inverters 47 and ground voltage terminal VS. In ring oscillation circuit section 51, transistor 50 is turned on when control signal $\overline{S1}$ is set to "1" level, permitting inverters 47 to be operable, and pulse signal OSC of a preset frequency is output from the final stage inverter 47.

In the booster circuit described above, booster section 52 utilizing so-called charge-pumping technique is provided. When pulse signal OSC is output from ring oscillation circuit section 51 in the data programming mode, a voltage of node 54 is sequentially stepped up via capacitor 53 in response to variation in the amplitude of pulse signal OSC. The voltage of node 54 is transmitted to output node 17 of voltage HV3 via the current path of E-type rectifying MOS transistor 55. Further, the voltage of node 17 is transmitted to output node 16 of voltage HV2 via the current path of E-type rectifying MOS transistor 56. When control signal S1 is set to "1" level, the potential of node 17 is set to ground voltage VS via the current paths of D-type MOS transistor 57 and E-type MOS transistor 58. Likewise, the potential of node 16 is set to ground voltage VS via the current paths of D-type MOS transistor 59 and E-type transistor 60. The transistors constituting the booster circuit are all of N-channel type. High voltage HV1 is selectively output via a MOS transistor which is connected to receive external programming voltage VP at one end of the current path and whose gate is connected to receive a voltage generated from booster circuit 52.

In the EPROM, the row decoder and data programming circuit are formed to generate high voltages in addition to the column decoder.

FIG. 9 is a circuit diagram showing the construction of a semiconductor integrated circuit according to a second embodiment of this invention. The circuit of FIG. 9 is obtained by modifying row decoder 131 of the EPROM shown in FIG. 1 according to this invention. In the FIG. 9 circuit, the current paths of three E-type N-channel MOS transistors 72, 73 and 74 are connected in series between node 71 and ground voltage terminal VS, for example. The gates of MOS transistors 72 and 74 are connected to receive an output of a row-decoder as will be described later. Further, an m number of E-type N-channel MOS transistors 75-1 to 75-m which correspond in number to row lines WL are connected at one end of the current path to node 71. Only one of MOS transistors 75-1 to 75-m is selectively turned on by an address signal (not shown). P-channel MOS transistors 76-1 to 76-m are each connected as a load transistor between the other end of the current path of a corresponding one of MOS transistors 75-1 to 75-m and voltage terminal VC. The other end of the current path of each MOS transistor 75-1 to 75-m is also connected to an input node of a corresponding one of CMOS inverters 77-1 to 77-m which are each formed of P- and N-channel MOS transistors. Each of output nodes 78-1 to 78-m of CMOS inverters 77-1 to 77-m is connected to one end of the current path of a corresponding one of D-type N-channel MOS transistors 79-1 to 79-m which are respectively connected at the other end of the current path to row lines WL1 to WLm. The gates of MOS transistors 79-1 to 79-m are connected to receive control signal S3. Row lines WL1 to WLm ar respectively connected to output circuits 80-1 to 80-m for controlling supply of high voltage VP. Each of output circuits 80-1 to 80-m includes E-type N-channel MOS transistor 82 and D-type N-channel MOS transistor 83 whose current paths are connected in series between row line WL1 to WLm and node 81 to which high voltage VP is applied. The gate of MOS transistor 82 is connected to receive a voltage higher than high voltage VP, and the gate of MOS transistor 83 is connected to a corresponding one of row lines WL1 to WLm.

Figures 10, 11:
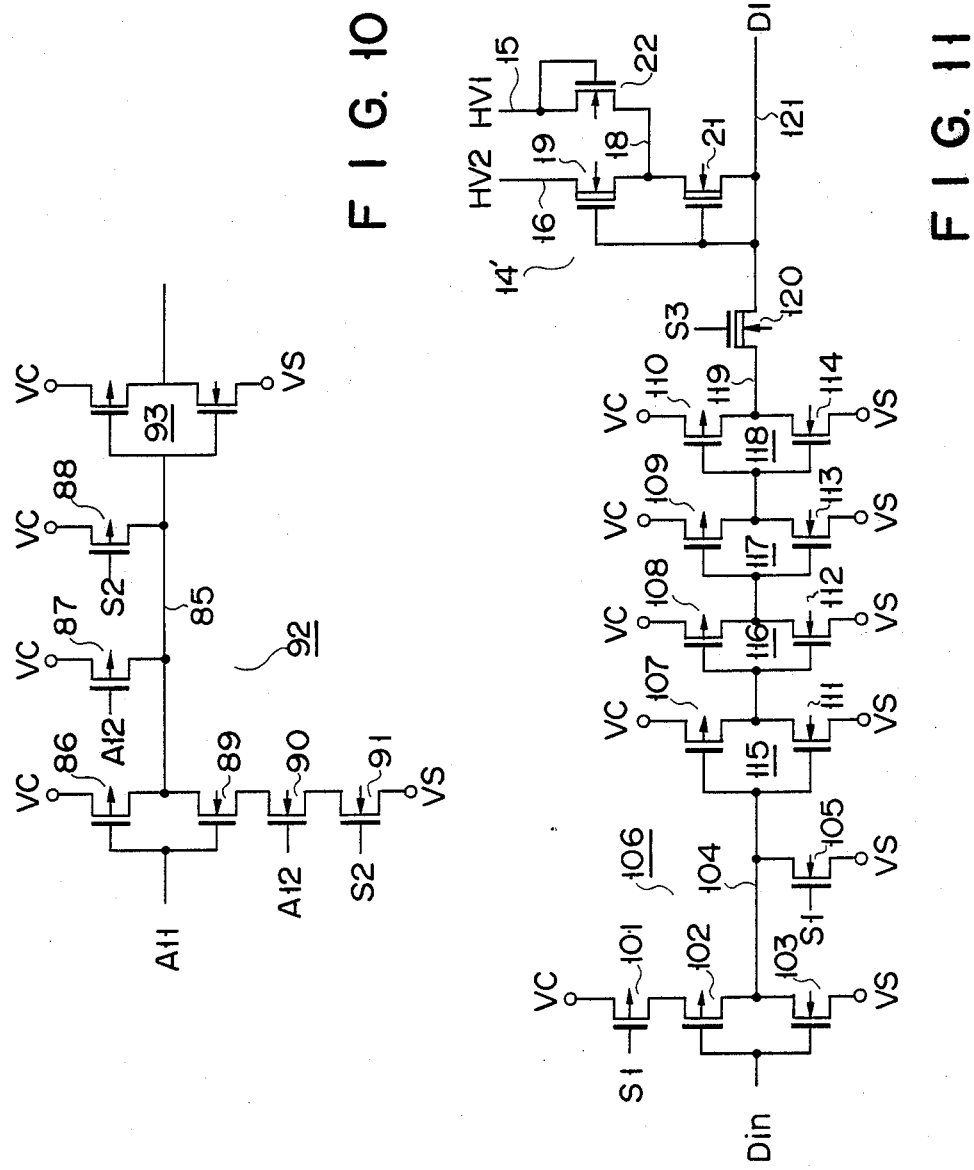
FIG. 10 is a circuit diagram showing the detail construction of a row pre-decoder used in the circuit of FIG. 9.
FIG. 11 is a circuit diagram showing a data programming circuit used in an EPROM according to a third embodiment of this invention.

FIG. 10 is a circuit diagram showing the detail construction of a row pre-decoder for outputting a gate control signal to the gates of MOS transistors 72 to 74 shown in FIG. 9. In this case, the row pre-decoder is constituted to process two-bit address input. For example, it includes three E-type P-channel MOS transistors 86 to 88 having the current paths connected in parallel between voltage terminal VC and node 85 and three E-type N-channel MOS transistors 89 to 91 having the current paths connected in series between node 85 and ground voltage terminal VS. MOS transistors 86 to 91 are combined to constituted three-input CMOS NAND circuit 92 operated in response to address signals A11 and A12 and control signal S2. An output of NAND circuit 92 is supplied to CMOS inverter 93 constituted by P- and N-channel MOS transistors, and an output of inverter 93 is supplied as an output of one of the row pre-decoders to the gate of a corresponding one of MOS transistors 72 to 74 of FIG. 9, for example, MOS transistor 72.

In the circuit of the second embodiment, row line WLj (j=1, 2, ..., m) is supplied with high voltage VP via output circuit 80 in the programming mode, and then control signal S3 is set to "0" level at the beginning of the verify mode, setting D-type transistor 79j in the nonconductive state. In a period of time in which transistor 79j is kept nonconductive, an output of the row pre-decoder shown in FIG. 10 is forcedly set to "0" while control signal S2 is generated, thereby preventing the potential of node 71 from being set to "0" level. Therefore, the input node of inverter 77j is set to "1" level by means of transistor 76j connected to row line WLj selected in the programming mode, and the N-channel MOS transistor of inverter 77j is set conductive. As a result, a high voltage supplied to selected row line WLj is discharged via D-type MOS transistor 79j set in the nonconductive state and the N-channel MOS transistor of inverter 77j in the same manner as in the embodiment of FIG. 4.

FIG. 11 is a circuit diagram showing the construction of a semiconductor integrated circuit according to a third embodiment of this invention. The circuit of this embodiment is obtained by modifying data programming circuit 135 of the EPROM shown in FIG. 1 according to this invention. In the FIG. 11 circuit, the current paths of two E-type P-channel MOS transistors 101 and 102 and E-type P-channel MOS transistor 103 are connected in series between voltage terminal VC and ground voltage terminal VS. The current path of E-type N-channel MOS transistor 105 is connected between ground voltage terminal VS and node 104 between transistors 102 and 103. MOS transistors 101, 102, 103 and 105 are combined to constitute CMOS NOR circuit 106. Data Din is supplied to the gates of MOS transistors 102 and 103, and control signal S1 is supplied to the gates of MOS transistors 101 and 105. Node 104 is connected to a first one of cascade-connected CMOS inverters 115 to 118 which are respectively formed of E-type CMOS inverters 115 to 118 which are respectively formed of E-type P-channel MOS transistors 107 to 110 and E-type N-channel MOS transistors 111 to 114. Output node 119 of final stage inverter 118 is connected to one end of the current path of D-type N-channel MOS transistor 120 whose gate is connected to receive control signal S3. The other end of the current path of transistor 120 is connected to input node 121 for programming data DIN. Output node 121 is further connected to output circuit 14' obtained by omitting transistor 20 from output circuit 14 in the circuit of FIG. 4.

In the data programming circuit used in the circuit of this embodiment, data DIN is kept at ground voltage VS in the data readout mode and is not set to voltage VC. Therefore, current will not flow into node 16, and consequently transistor 20 used for interrupting the current path can be omitted.

FIGS. 12 and 13 are circuit diagrams showing the construction of modifications of the circuit shown in FIG. 4. In the circuit of the first embodiment, N-channel MOS transistor 10 of inverter 11 is set in the conductive state for a preset period of time irrespective of the address signal in the verify mode. For this purpose, the transistor controlled by control signal S2 is connected to the row pre-decoder. In contrast, in the modified circuit shown in FIG. 12, the current path of N-channel MOS transistor 23 controlled by control signal S2 is connected between transistor 5 and ground voltage terminal VS, and the current path of P-channel MOS transistor 24 controlled by control signal S2 is connected between voltage terminal VC and node 1.

Further, in the modified circuit shown in FIG. 13, the current path of P-channel MOS transistor 25 controlled by control signal S2 is connected between voltage terminal VC and transistor 9, and the current path of N-channel MOS transistor 26 controlled by control signal S2 is connected between output node 12 of inverter 11 and ground voltage terminal VS.

This invention is not limited to the first to third embodiments described above, and it is of course possible to variously modify this invention. For example, in the circuit of the first embodiment shown in FIG. 4, MOS transistor 13 is formed on N-channel type, but the MOS transistor can be replaced by an E-type MOS transistor when a signal stepped up to a higher voltage level than voltage VC can be applied as control signal S3.

FIG. 14 is a circuit diagram of a semiconductor integrated circuit according to a fourth embodiment of this invention. The FIG. 14 circuit is a circuit section relating to one of column selection lines COLi of column decoder 132 (shown in FIG. 1) in a case where this invention is applied to the EPROM of FIG. 1. For example, column selection signal IN is supplied to input node 214 of CMOS inverter 213 constituted by E-type P-channel MOS transistor 211 and N-channel MOS transistor 212 having current paths connected between readout terminal VC and ground voltage terminals VS which are respectively set 5 V and 0 V. Output node 215 of CMOS inverter 213 is connected to one end of the current path of D-type N-channel MOS transistor 216 whose gate is connected to receive control signal W/R. The other end of the current path of MOS transistor 216 is connected to a corresponding one of column selection lines COLi. Control signal W/R is set to a ground voltage ("0" level) in the data programming mode, and to voltage VC ("1" level) in the data readout mode.

Booster circuits 217 and 218 step up external programming voltage VP to output high voltages VH1 and VH2. The current path of D-type N-channel MOS transistor 221 whose gate is connected to column selection line COLi is connected between output node 219 of booster circuit 217 for outputting high voltage VH1 and node 220. The current paths of E-type N-channel MOS transistor 222 and D-type N-channel MOS transistor 223 are connected in series between node 220 and column selection line COLi. The gate of MOS transistor 222 is connected to output node 224 of booster circuit 218 for outputting high voltage VH2 and the gate of MOS transistor 223 is connected to column selection line COLi.

Further, the current paths of E-type N-channel MOS transistor 226 and E-type N-channel MOS transistor 227 are connected in series between node 225 to which external programming voltage VP is applied and node 220. The gate of MOS transistor 226 is connected to output node 224 of booster circuit 218 and the gate of MOS transistor 227 is connected to the drain thereof.

In this example, voltage VC, ground voltage VS, and high voltage VP are respectively set at 5 V, 0 V and 12.5 V. Further, stepped-up voltage VH1 is set to a voltage (VP+2 VthE) higher than voltage VP by two times threshold voltage VthE of an N-channel MOS transistor and stepped-up voltage VH2 is set to a voltage (VP+3 VthE) higher than voltage VP by three times threshold voltage VthE of the N-channel MOS transistor. Therefore, if threshold voltage VthE is set to 2 V, voltages VH1 and VH2 will be respectively set to 16.5 V and 18.5 V.

Now, the operation of the circuit described above is explained. When data is programmed into memory cell Mji (j is an integer of 1 to m, and i is an integer of 1 to n) shown in FIG. 1, control signal W/R is set to "0" level (0 V). At this time, if column selection signal IN is at "0" level, P-channel MOS transistor 211 of inverter 213 is turned on and N-channel MOS transistor 212 is turned off, setting a signal of output node 215 to voltage VC of 5 V. In this case, since a signal of 0 V is applied to the gate of D-type MOS transistor 216, a voltage equal to the absolute value of the threshold voltage of a D-type MOS transistor is supplied to column selection line COLi via MOS transistor 216. The voltage is 2.5 V to 3 V, for example. Therefore MOS transistors 223 and 221 whose gates are connected to column selection line COLi are set into the conductive state. Since, at this time, high voltage VH2 is generated from booster circuit 218, MOS transistors 222 and 226 whose gates are connected to output node 224 are set into conductive state. Therefore, high voltage VP is supplied to column selection line COLi via the current paths of transistors 226, 227, 222 and 223, and the column selection line is abruptly stepped up to voltage VP. Further, high voltage VH1 is generated from booster circuit 217, and high voltage VH2 which higher than high voltage VH1 by the threshold voltage of E-type N-channel MOS transistor 222 is applied to the gate of transistor 222. Therefore, high voltage VH1 can be supplied to column selection line COLi via the serial current paths of transistors 221, 222 and 223 without causing a voltage drop due to the presence of transistor 222. In this case, since voltage VC of 5 V at output node 215 of inverter 213 is applied to one end of the current path of D-type transistor 216, transistor 216 is turned off. Accordingly, high voltage VH1 supplied to column selection line COLi will not be applied to transistors 211 and 212 in the low voltage-operated circuit. When high voltage VH1 is thus supplied to column selection line COLi, that one of transistors Ci in FIG. 1 which is connected to column selection line COLi is turned on. At this time, since gate voltage VH1 is set to a voltage level higher than high voltage VP by two times the threshold voltage of an E-type MOS transistor, a voltage drop of the threshold voltage due to the presence of transistor Ci will not occur, and high voltage VP can be supplied to a corresponding column line Bi.

In a case where column selection signal In is at "1" level in the programming mode, P-channel MOS transistor 211 of inverter 213 is turned off and N-channel MOS transistor 212 is turned on, setting output node 215 of inverter 213 to 0 V. As a result, column selection line COLi is set to 0 V via D-type transistor 216. In this case, current flows from node 225 of high voltage VP via the series current paths of MOS transistors 226, 227, 222, 223, 216 and 212. If the dimensions of transistors 226, 227, 222, 223, 216 and 212 are so determined that a voltage of node 220 can be set higher than the absolute value of the threshold voltage of transistor 221 at this time, transistor 221 is turned off, preventing the loss of current from booster circuit 217.

In a case where data is read out from memory cell Mji, voltages VH1 and VH2 from booster circuits 217 and 218 and high voltage VP are all set to 0 V, and control signal W/R is set to "1" level (5 V). At this time, if column selection signal IN is at "0" level, P-channel MOS transistor 211 of inverter 213 is turned on and N-channel MOS transistor 212 is turned off, setting a signal of output node 215 to voltage VC of 5 V. The voltage is supplied via transistor 216 to set column selection line COLi to 5 V. Since transistor 222 is set in the nonconductive state, a voltage of column selection line COLi which is set at 5 V is prevented from being discharged to 0 V via booster circuit 217 or node 225. In contrast, if column selection signal IN is at "1" level, P-channel MOS transistor 211 of inverter 213 is turned off and N-channel MOS transistor 212 is turned on, setting column selection line COLi to 0 V.

An n number of circuits each having the same construction as the circuit of FIG. 14 are used so as to correspond in number to column selection lines COLi. Further, if the EPROM shown in FIG. 1 is formed of the plural-bit structure, FIG. 14 circuits of a number equal to n times the number of bits are provided. Data programming circuit 135 of the EPROM shown in FIG. 1 includes a circuit having the same construction as the circuit of FIG. 14. In this case, however, programming data is input instead of the column selection signal. Thus, in a case where the EPROM is formed of a plural-bit structure, the circuits which are formed to have the same construction as the circuit of FIG. 14 and which is equal in number to n times the number of bits are provided in data programming circuit 135. Also, in this case, booster circuits 217 and 218 can be commonly used in all the circuits.

In the circuit of FIG. 14, transistors in the high voltage-operated circuit to which a high voltage is applied, or transistors 216, 221, 222, 223, 226 and 227 are all formed of N-channel type, and are all formed of the LDD structure so as to have a high withstanding voltage. Therefore, in the high voltage-operated circuit, formation of P-channel MOS transistor is not necessary, and occurrence of the latch-up which has been the problem in the prior art will be prevented. Further, since formation of P-channel MOS transistor which is formed to have a high withstanding voltage is necessary, it becomes unnecessary to form an N-well region to which a high voltage is applied, thereby reducing the size of the entire area. In the data readout mode, a D.C. current consumption can be suppressed to substantially 0 as in the case of the conventional CMOS structure.

That is, in the circuit of the fourth embodiment, the high voltage-operated circuit is formed on only N-channel MOS transistors as in the first to third embodiments, and a high voltage is selectively output in the data programming mode to improve the programming characteristics. Further, in the data readout mode, the current consumption can be suppressed to 0 as in the case of CMOS structure.

FIGS. 15 to 17 are circuit diagram showing the detail construction of booster circuits 217 and 218. FIG. 15 shows the construction of a ring oscillation circuit for generating pulse signal OSC used in booster circuits 21 and 218. The ring oscillation circuit is formed with the well known construction, and includes an odd number (five in FIG. 15) of series-connected E/D type inverters 233 each having D-type MOS transistor 231 as a load transistor and E-type MOS transistor 232 as a driving transistor. Delay circuits 236 each of which includes D-type MOS transistor 234 and capacitor 235 are each connected between the successive two of inverters 233. In this case, an output of the inverter of the last stage is supplied together with inverted signal $\overline{W}/$ of control signal W/R to NAND circuit 240 constituted by D-type MOS transistor 237 and two E-type MOS transistors 238 and 239. The current path of E-type MOS transistor 241 whose gate is connected to receive control signal W/R is connected between inverters 22 and ground voltage terminal VS. All the transistors used in the circuit of FIG. 15 are formed on N-channel type.

When control signal W/R is set at "1" level (VC) in the ring oscillation circuit, transistor 241 is turned on to set inverters 233 in an operable condition. Further, transistor 239 of NAND circuit 240 is turned on to make NAND circuit 240 function as an inverter, thereby causing pulse signal OSC of a preset frequency to be generated from NAND circuit 240.

FIG. 16 shows the detail construction of booster circuit 217 for generating voltage VH1 using signal OSC from the ring oscillation circuit shown in FIG. 15. Booster circuit 217 is operated based on so-called charge-pumping technique. When pulse signal OSC is output from the ring oscillation circuit of FIG. 15 in the data programming mode, a voltage of node 252 is sequentially stepped up via capacitor 251 in response to variation in the amplitude of pulse signal OSC. The voltage of node 252 is transmitted to output node 219 of voltage VH3 via the current path of E-type rectifying MOS transistor 253. Further, the current paths of E-type MOS transistors 254 and 255 are connected in series between node 219 and node 225 to which high voltage VP is applied. Therefore, when a voltage of node 219 is raised to more than (VP+2 VthE), current starts to flow from node 219 to high voltage terminal VP, thus setting voltage VH1 substantially to (VP+2 VthE). In the data readout mode, voltage of node 219 is set to voltage VS via the current paths of E-type MOS transistor 256 and D-type MOS transistor 257.

FIG. 17 shows the detail construction of booster circuit 218 for generating voltage VH2 using pulse signal OSC from the ring oscillation circuit shown in FIG. 15. Booster circuit 217 is also operated based on so-called charge-pumping technique. When pulse signal OSC is output from the ring oscillation circuit of FIG. 15 in the data programming mode, a voltage of node 262 is sequentially stepped up via capacitor 261 in response to variation in the amplitude of pulse signal OSC. The current paths of E-type MOS transistors 263 to 266 are connected in series between node 262 and 225 to which high voltage VP is applied. Therefore, when a voltage of node 262 is raised to more than (VP+4 VthE), current starts to flow from node 262 to high voltage terminal VP, thus setting a voltage of node 262 substantially to (VP+4 VthE). The voltage of node 262 is transmitted to output node 224 of voltage VH2 via the current path of E-type rectifying MOS transistor 267. Therefore, a voltage of node 224 is set to (VP+3 VthE) which is obtained by subtracting threshold voltage VthE of an E-type MOS transistor from the voltage of node 262. In the data readout mode, a voltage of node 224 is set to voltage VS via the current paths of E-type MOS transistor 267 and D-type MOS transistor 268.

FIGS. 18 to 20 are circuit diagrams respectively showing semiconductor integrated circuits according to fifth to seventh embodiments of this invention. Each of circuits corresponds to a circuit section connected to one of column selection lines COLi of column decoder 132 shown in FIG. 1.

The circuit shown in FIG. 18 is obtained by omitting E-type MOS transistor 227 from the circuit shown in FIG. 14, and connecting the gate of E-type MOS transistor 226 to node 225 of high voltage VP instead of output node 224 of booster circuit 218.

The circuit shown in FIG. 19 is obtained by omitting E-type MOS transistor 227 as in the case of FIG. 18, connecting the gate of E-type MOS transistor 226 to node 225 of high voltage VP, and connecting the current path of E-type MOS transistor 222 between D-type MOS transistor 223 and column selection line COLi.

The circuit shown in FIG. 20 is obtained by omitting E-type MOS transistor 227 as in the case of FIG. 18, connecting the gate of E-type MOS transistor 226 to node 225 of high voltage VP, and connecting the current path of E-type MOS transistor 222 between output node 219 of booster circuit 217 and D-type MOS transistor 223.

That is, MOS transistor 227 is provided in order to prevent current from flowing from node 219 to node 225 when node 225 of high voltage VP is set to ground voltages VS while voltage VH1 is being applied to output node 219 of booster circuit 217 and D-type MOS transistor 221 is kept conductive. Therefore, MOS transistor 227 can be omitted if such a problem does not occur. Further, MOS transistor 226 is used to control of supply of high voltage VP to column selection line COLi. If a voltage of column selection line COLi can be permitted to be set slightly lower than voltage VP, it is possible to connect the gate of transistor 226 to node 225 of high voltage VP.

MOS transistor 222 is used to prevent current from flowing to node 219 when column selection line COLi is set at voltage VC in the data readout mode. Therefore, it is only necessary to connect the current path of transistor 222 between node 219 and column selection line COLi. In this case, in the nonselection state, the potential difference between the source and gate of transistor 222 is set to be substantially equal to voltage VH2 in the circuit of FIG. 19, and set to a voltage level lower than voltage VH2 by the voltage of node 220 in the circuit of FIG. 18. Thus, the potential difference between the source and gate of transistor 222 is set lower in the circuit of FIG. 18 than in the circuit of FIG. 19, and therefore the circuit of FIG. 18 is advantageous over the circuit of FIG. 19 in the breakdown of the gate insulation film due to the voltage stress for a long period of time. However, a parasitic capacitance associated with column selection line COLi is smaller in the circuit of FIG. 19 than in the circuits of FIGS. 18 and 20, and the circuit of FIG. 19 is advantageous in the charging and discharging time.

Figure 21:
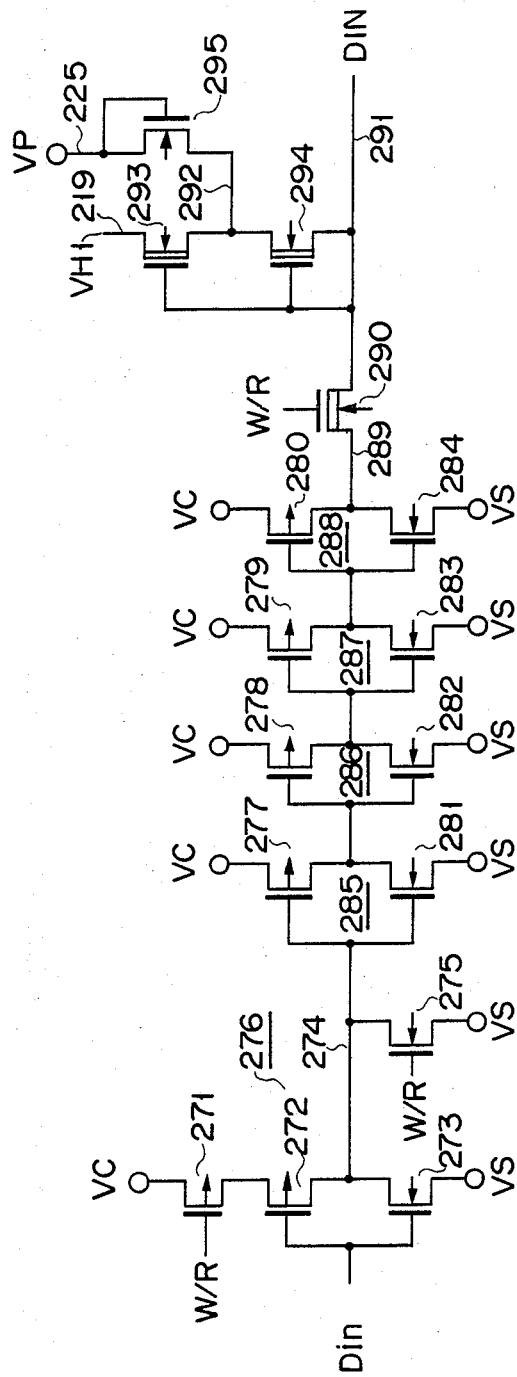
FIG. 21 is a circuit diagram showing the construction of a data programming circuit used in an EPROM according to an eighth embodiment of this invention.

FIG. 21 is a circuit diagram of a semiconductor integrated circuit according to an eighth embodiment by this invention. The circuit of this embodiment can be attained by modifying data programming circuit 135 of the EPROM in FIG. 1 according to this invention as in the case of the circuit shown in FIG. 11. In the FIG. 21 circuit, the current paths of E-type P-channel MOS transistors 271 and 272 and E-type N-channel MOS transistor 273 are connected in series between voltage terminal VC and ground voltage terminal VS. The current path of E-type N-channel MOS transistor 275 is connected between ground voltage terminal VS and connection node 274 between MOS transistors 272 and 273. MOS transistors 271, 272, 273 and 275 are connected to constitute CMOS NOR circuit 276. The gates of MOS transistors 272 and 273 are connected to receive data Din, and control signal W/R is supplied to the gates of MOS transistors 271 and 275. Node 274 is connected to a first one of cascade-connected CMOS inverters 285 to 288 which are respectively formed of E-type P-channel MOS transistors 277 to 280 and E-type N-channel MOS transistors 281 to 284. Output node 289 of the last stage inverter 288 is connected to one end of D-type N-channel MOS transistor 290 whose gate is connected to receive control signal W/R. The other end of the current path of MOS transistor 290 is connected to output node 291 for programming data Din. Further, the current path of D-type N-channel MOS transistor 293 whose gate is connected to output node 291 for programming data Din is connected between node 292 and output node 291 of voltage VH1 of booster circuit 217 shown in FIG. 16. The current path of D-type N-channel MOS transistor 294 whose gate is connected to output node 291 is connected between nodes 291 and 292. Further, the current path of E-type P-channel MOS transistor 295 whose gate is connected to output node 225 is connected between node 292 and node 225 of high voltage VP.

In the high voltage-operated circuit section of the circuit of the eighth embodiment comprising MOS transistors 290 and 293 to 295, E-type N-channel MOS transistor 222 whose gate is connected to receive boosted voltage VH2 is omitted. That is, in the programming circuit, Din is always kept at ground voltage VS and is not set to VC, and there is no possibility that current flows into node 219 so that MOS transistor 222 used for interrupting the current path can be omitted.

This invention has been described with reference to the embodiments, but this invention is not limited to the embodiments and can be variously modified. For example, in the circuit of FIG. 14, MOS transistor 216 is formed of D-type. However, it can be replaced by an E-type MOS transistor when a signal higher than VC can be supplied to as control signal W/R. Further, this invention can be applied to a semiconductor integrated circuit comprising only N-channel MOS transistors, and in this case, current consumption can be suppressed.

As described above, according to this invention, a semiconductor integrated circuit device can be obtained in which latch-up can be prevented and the chip size can be kept small.

What is claimed is:

1. A semiconductor integrated circuit device comprising:
 a CMOS circuit operated on a voltage of a first voltage level;
 an output circuit for controlling supply of a voltage of a second voltage level which is higher than the first voltage level to a signal output node, said output circuit including a first node to which a voltage of a third voltage level lower than the second voltage level is applied, a second node to which a voltage of the second voltage level is applied, a first MOS transistor of a depletion type having a current path connected between the second node and a third node and a gate connected to said signal output node, a second MOS transistor of an enhancement type having a current path connected between the first and third nodes and a gate connected to the first node, and a third MOS transistor of the enhancement type having a current path connected between the third node and said signal output node and a gate connected to a fourth node to which a voltage of a fourth voltage level higher than the third voltage level is applied;

an isolation MOS transistor having a current path connected between an output node of said CMOS circuit and said signal output node;

discharging means provided in said CMOS circuit to discharge the output node of said CMOS circuit, said discharging means discharging the output node of said CMOS circuit with the conduction resistance of said isolation MOS transistor kept high after the lapse of a period in which the voltage of the second voltage level is kept supplied from said output circuit to said signal output node; and control means for supplying a control signal to control the conduction state of said isolation MOS transistor, said control means supplying the control signal to reduce the conduction resistance of said isolation MOS transistor after the discharging operation of the output node of said CMOS circuit by said discharging means is completed.

2. A semiconductor integrated circuit device comprising:

a CMOS circuit operated on a voltage of a first voltage level;

an output circuit for controlling supply of a voltage of a second voltage level which is higher than the first voltage level to a signal output node, said output circuit including a first node to which a voltage of the second voltage level is applied, a first MOS transistor of an enhancement type having a current path connected between the first node and a second node and a gate connected to receive a voltage of a third voltage level higher than the second voltage level, and a second MOS transistor having a current path connected between the second node and said signal output node and a gate connected to said signal output node;

an isolation MOS transistor having a current path connected between an output node of said CMOS circuit and said signal output node;

discharging means provided in said CMOS circuit to discharge the output node of said CMOS circuit, said discharging means discharging the output node of said CMOS circuit with the conduction resistance of said isolation MOS transistor kept high after the lapse of a period in which the voltage of the second voltage level is kept supplied from said output circuit to said signal output node; and control means for supplying a control signal to control the conduction state of said isolation MOS transistor, said control means supplying the control signal to reduce the conduction resistance of said isolation MOS transistor after the discharging operation of the output node of said CMOS circuit by said discharging means is completed.

3. A semiconductor integrated circuit device comprising:

a CMOS circuit supplied with a first potential and having an output mode;

an output circuit supplied with a second potential and having an output node, the second potential being higher than the first potential, the output node of said output circuit being charged to the second potential or discharged to a reference potential in response to an output data of the output node of said CMOS circuit;

an isolation MOS transistor having a drain, a source, and a gate, a drain-source path being connected between the output node of said CMOS circuit and the output node of said output circuit;

discharge means, provided in said CMOS circuit, for discharging the output node of said output circuit through said isolation MOS transistor, said discharge means discharging the output node of said output circuit toward the reference potential; and control means for supplying a control signal, the control signal being supplied to the gate of said isolation MOS transistor so as to control the conduction state of said isolation MOS transistor;

wherein:

the output node of said output circuit charges the second potential in response to the output data of said CMOS circuit when a potential of said control signal is the reference potential;

the second potential of the output node of said output circuit is discharged by said discharge means when the potential of said control signal is held at the reference potential; and after the output node of said output circuit has been completely discharged by said discharge means, the potential of said control signal changes from the reference potential to the first potential, and the output data of said CMOS circuit is supplied to the output node of said output circuit.

4. A semiconductor integrated circuit device according to claim 3, wherein said output circuit is constituted by MOS transistors of a one-channel type.

5. A semiconductor integrated circuit device according to claim 1, which further comprises a booster circuit for raising a voltage of the second voltage level, and wherein said booster circuit supplies a voltage of the third voltage level applied to said second node and a voltage of the fourth voltage level applied to said third MOS transistor.

6. A semiconductor integrated circuit device comprising:

first and second nodes which are respectively connected to receive first and second control signals;

a third node from which an output signal is supplied;

a fourth node connected to receive a high voltage;

a CMOS circuit including MOS transistors of first and second channel types and connected to receive the first control signal which is supplied to the first node;

a first MOS transistor of the first channel type having a current path connected between an output node of said CMOS circuit and said third node and a gate connected to said second node;

first and second booster circuits for generating voltages higher than the high applied to said fourth node;

a second MOS transistor of the first channel type and depletion type having a current path connected between an output node of a first booster circuit and a fifth node and a gate connected to said third node;

a third MOS transistor of the first channel type and enhancement type having a current path connected between said third and fifth nodes and a gate connected to an output node of said second booster circuit; and a fourth MOS transistor of the first channel type and enhancement type having a current path connected between said fourth and fifth nodes and a gate connected to receive a voltage higher than the high voltage applied to said fourth node.

7. A semiconductor integrated circuit device according to claim 6, wherein said first MOS transistor is of a depletion type.

8. A semiconductor integrated circuit device according to claim 6, wherein the gate of said fourth MOS transistor is connected to said fourth node.

9. A semiconductor integrated circuit device according to claim 6, which further comprises a third booster circuit for supplying a voltage higher than the high voltage applied to said fourth node, and in which the gate of said of said fourth MOS transistor is connected to the output node of said third booster circuit.

10. A semiconductor integrated circuit device according to claim 9, wherein said second and third booster circuits are formed of the same booster circuit.

11. A semiconductor integrated circuit device according to claim 6, further comprising a fifth MOS transistor of the first channel type and depletion type having a current path connected between said third and fifth nodes and a gate connected to said third node.

12. A semiconductor integrated circuit device according to claim 6, wherein the current path of said third MOS transistor is connected between the output node of said first booster circuit and said fifth node.

13. A semiconductor integrated circuit device comprising:

first and second nodes which are respectively connected to receive first and second control signals;

a third node from which an output signal is supplied;

a fourth node connected to receive a high voltage;

a CMOS circuit including MOS transistors of first and second channel types are connected to receive the first control signal which is supplied to the first node;

a first MOS transistor o the first channel type having a current path connected between an output node of said CMOS circuit and said third node and a gate connected to said second node;

a first booster circuit for generating a voltage higher than the high voltage applied to said fourth node;

a second MOS transistor of the first channel type and depletion type having a current path connected between an output node of said first booster circuit and a fifth node and a gate connected to said third node;

a third MOS transistor of the first channel type and depletion type having a current path connected between said third and fifth nodes and a gate connected to said third node; and a fourth MOS transistor of the first channel type and enhancement type having a current path connected between said fourth and fifth nodes and a gate connected to said fourth node.

14. A semiconductor integrated circuit device according to claim 13, wherein said first MOS transistor is of a depletion type.

* * * * *